United States Patent
Li

(10) Patent No.: US 11,693,283 B2
(45) Date of Patent: Jul. 4, 2023

(54) ELECTROSTATIC PROTECTION CIRCUIT OF DISPLAY PANEL, METHOD, DISPLAY PANEL, AND DISPLAY DEVICE

(71) Applicant: Shenzhen China Star Optoelectronics Semiconductor Display Technology Co., Ltd., Guangdong (CN)

(72) Inventor: Yi Li, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 324 days.

(21) Appl. No.: 17/056,024

(22) PCT Filed: Sep. 11, 2020

(86) PCT No.: PCT/CN2020/114776
§ 371 (c)(1),
(2) Date: Nov. 17, 2020

(87) PCT Pub. No.: WO2022/041328
PCT Pub. Date: Mar. 3, 2022

(65) Prior Publication Data
US 2022/0221764 A1    Jul. 14, 2022

(30) Foreign Application Priority Data
Aug. 27, 2020 (CN) .......................... 202010875786.7

(51) Int. Cl.
*G02F 1/1362* (2006.01)
*H01L 27/02* (2006.01)
*H10K 59/131* (2023.01)

(52) U.S. Cl.
CPC .. *G02F 1/136204* (2013.01); *G02F 1/136254* (2021.01); *G02F 1/136286* (2013.01); *H01L 27/0248* (2013.01); *H10K 59/131* (2023.02)

(58) Field of Classification Search
CPC ......... G02F 1/136204; G02F 1/136286; G02F 2202/22; H01L 27/0248
See application file for complete search history.

(56) References Cited

U.S. PATENT DOCUMENTS

| | | | |
|---|---|---|---|
| 2002/0057410 A1 | 5/2002 | Tanaka | |
| 2014/0001966 A1* | 1/2014 | Cho | H05B 33/10 315/161 |
| 2015/0325188 A1* | 11/2015 | Wei | G02F 1/136204 345/92 |
| 2018/0228064 A1 | 8/2018 | Xu et al. | |

FOREIGN PATENT DOCUMENTS

| | | | |
|---|---|---|---|
| CN | 102789072 | | 11/2012 |
| CN | 102789072 A | * | 11/2012 |
| CN | 105848394 | | 8/2017 |
| CN | 107861658 | | 3/2018 |
| CN | 111367125 | | 7/2020 |
| JP | 4238469 | | 3/2009 |

* cited by examiner

*Primary Examiner — Jessica M Merlin*

(57) ABSTRACT

The present disclosure provides an electrostatic protection circuit for display panels, a method, a display panel, and a display device. The display panel includes an array substrate, a chip on film (COF) substrate connected to the array substrate, and at least a remaining testing line. The electrostatic protection circuit includes at least a first electrostatic protection line configured to connect at least the remaining testing line to a grounding line of the COF substrate.

19 Claims, 4 Drawing Sheets

ELECTROSTATIC PROTECTION CIRCUIT OF DISPLAY PANEL, METHOD, DISPLAY PANEL, AND DISPLAY DEVICE

RELATED APPLICATIONS

This application is a National Phase of PCT Patent Application No. PCT/CN2020/114776 having International filing date of Sep. 11, 2020, which claims the benefit of priority of Chinese Patent Application No. 202010875786.7 filed on Aug. 27, 2020. The contents of the above applications are all incorporated by reference as if fully set forth herein in their entirety.

FIELD AND BACKGROUND OF THE INVENTION

The present disclosure relates to the field of electrostatic protection of display technology, and more particularly, to an electrostatic protection circuit and an electrostatic protection method of a display panel, the display panel, and a display device configured to use the electrostatic protection method.

During a manufacturing process of a display panel, image quality of a product is tested at a cell stage in order to avoid material waste. A plurality of testing lines, such as a plurality of shorting bars, are usually disposed on an outer lead bonding (OLB) area, and then the OLB area is sealed after testing. But for a display panel product with a narrow bezels, external static electricity can be easily introduced into a chip on film (COF) by the shorting bars remaining the OLB area when under no protection of a bezel, causing electrostatic damage to the COF and reducing electrostatic discharge (ESD) ability of the display panel.

SUMMARY OF THE INVENTION

The present disclosure aims to solve a problem that existing display panel is easy to generate static electricity due to testing lines. An electrostatic protection circuit of the display panel is provided to protect a whole display panel by reducing a generation of the static electricity.

On the one hand, the present disclosure provides an electrostatic protection circuit of a display panel, wherein the display panel includes an array substrate, a chip on film (COF) substrate connected to the array substrate, and at least a remaining testing line;
    wherein the electrostatic protection circuit includes:
        at least a first electrostatic protection line configured to connect at least the remaining testing line to a grounding line of the COF substrate.

In a possible embodiment of the present disclosure, the COF substrate includes at least an unused soldering pin;
    wherein the electrostatic protection circuit further includes:
        at least a second electrostatic protection line configured to connect at least the unused soldering pin to at least the first electrostatic protection line; and
        at least a third electrostatic protection line configured to connect at least the unused soldering pin to the grounding line of the COF substrate.

In a possible embodiment of the present disclosure, the display panel further includes a printed circuit board connected to the array substrate by the COF substrate, and the COF substrate includes at least an unused soldering pin;
    wherein the electrostatic protection circuit further includes:
        at least a second electrostatic protection line configured to connect at least the unused soldering pin to at least the first electrostatic protection line; and
        a fourth electrostatic protection line configured to connect the grounding line of the COF substrate to a grounding pin of the printed circuit board.

In a possible embodiment of the present disclosure, the display panel further includes a printed circuit board connected to the array substrate by the COF substrate, and the COF substrate includes at least an unused soldering pin;
    wherein the electrostatic protection circuit further includes:
        at least a third electrostatic protection line configured to connect at least the unused soldering pin to the grounding line of the COF substrate; and
        a fourth electrostatic protection line configured to connect the grounding line of the COF substrate to a grounding pin of the printed circuit board.

In a possible embodiment of the present disclosure, the display panel further includes a printed circuit board connected to the array substrate by the COF substrate, and the COF substrate includes at least an unused soldering pin;
    wherein the electrostatic protection circuit further includes:
        at least a second electrostatic protection line configured to connect at least the unused soldering pin to at least the first electrostatic protection line;
        at least a third electrostatic protection line configured to connect at least the unused soldering pin to the grounding line of the COF substrate; and
        a fourth electrostatic protection line configured to connect the grounding line of the COF substrate to a grounding pin of the printed circuit board.

In a possible embodiment of the present disclosure, the COF substrate includes at least an unused soldering pin;
    wherein the electrostatic protection circuit further includes:
        at least a second electrostatic protection line configured to connect at least the unused soldering pin to at least the first electrostatic protection line.

In a possible embodiment of the present disclosure, the COF substrate includes at least an unused soldering pin;
    wherein the electrostatic protection circuit further includes:
        at least a third electrostatic protection line configured to connect at least the unused soldering pin to the grounding line of the COF substrate.

In a possible embodiment of the present disclosure, the display panel further includes a printed circuit board connected to the array substrate by the COF substrate;
    wherein the electrostatic protection circuit further includes:
        a fourth electrostatic protection line configured to connect the grounding line of the COF substrate to a grounding pin of the printed circuit board.

In a possible embodiment of the present disclosure, the display panel includes three remaining testing lines.

In a possible embodiment of the present disclosure, a plurality of line electrodes parallel to each other are disposed on the array substrate.

Another object of the present disclosure is to provide an electrostatic protection method of a display panel. The display panel includes an array substrate, at least a COF substrate connected to the array substrate, and a plurality of line electrodes parallel to each other disposed on the array substrate, wherein the method includes:

disposing a first testing line, a second testing line, and a third testing line respectively connected to a data line configured to test a R signal, a G signal, and a B signal of the display panel, during a process of testing an image quality of the display panel;

choosing three adjacent line electrodes from the plurality of line electrodes parallel to each other, and connecting the three adjacent line electrodes sequentially to the first testing line, the second testing line, and the third testing line respectively, until all of the plurality of line electrodes parallel to each other are connected to the first testing line, the second testing line, and the third testing line respectively;

electrically isolating the first testing line, the second testing line, and the third testing line from the plurality of line electrodes parallel to each other to obtain three remaining testing lines, after the process of testing the image quality of the display panel by the first testing line, the second testing line, and the third testing line;

connecting the three remaining testing lines to a grounding line of at least the COF substrate by an electrostatic protection line.

In a possible embodiment of the present disclosure, at least the COF substrate includes at least an unused soldering pin, and the electrostatic protection method further includes:

connecting at least the unused soldering pin to the grounding line of at least the COF substrate.

In a possible embodiment of the present disclosure, the display panel includes a plurality of COF substrates sequentially connected to the array substrate, and a gate on array (GOA) signal of the display panel is imported into the display panel only through a first COF substrate and a last COF substrate, wherein the electrostatic protection method further includes:

connecting a plurality of soldering pins of a remaining COF substrate, except soldering pins of the first COF substrate and of the last COF substrate, to the grounding line of at least the COF substrate, wherein the plurality of soldering pins of the remaining COF substrate are disposed on a same position of a plurality of soldering pins of the first COF substrate and the last COF substrate.

In a possible embodiment of the present disclosure, the display panel further includes a printed circuit board, wherein the electrostatic protection method further includes:

connecting the grounding line of at least the COF substrate to a grounding pin of the printed circuit board.

In a possible embodiment of the present disclosure, the display panel further includes a printed circuit board, and at least the COF substrate includes at least an unused soldering pin, wherein the electrostatic protection method further includes:

connecting at least the unused soldering pin to the grounding line of at least the COF substrate, and connecting the grounding line of the COF substrate to a grounding pin of the print circuit board.

In a possible embodiment of the present disclosure, the step of isolating the first testing line, the second testing line, and the third testing line from the plurality of line electrodes parallel to each other to obtain the three remaining testing lines, after the process of testing the image quality of the display panel by the first testing line, the second testing line, and the third testing line includes:

isolating the first testing line, the second testing line, and the third testing line from the plurality of line electrodes parallel to each other by laser cutting to obtain the three remaining testing lines.

In a possible embodiment of the present disclosure, the first testing line, the second testing line, and the third testing line are respectively connected to a data line configured to test an R signal, a G signal, and a B signal of the display panel during a process of testing an image quality of the display panel.

Another object of the present disclosure is to provide a display panel configured to use the electrostatic protection method.

In a possible embodiment of the present disclosure, the display panel includes a thin-film transistor liquid crystal display (TFT-LCD) panel, an organic light-emitting diode (OLED) display panel, a micro light-emitting diode (micro LED) display panel, a mini light-emitting diode (mini LED) display panel, or an ultra light-emitting diode (PLED) display panel.

Another object of the present disclosure is to provide a display device including the display panel.

The electrostatic protection circuit of the display panel provided by the present disclosure can quickly release the static electricity generated by the display panel by connecting the remaining testing lines of the display panel to the grounding line of the COF substrate by the first electrostatic protection line, thereby reducing the generation of the static electricity, and further protecting the a display panel and the display device using the display panel.

BRIEF DESCRIPTION OF THE SEVERAL VIEWS OF THE DRAWINGS

In order to more clearly illustrate the technical solution in the present disclosure, the following will illustrate the figures used for describing the embodiments or the prior art. It is obvious that the following figures are only some embodiments of the present disclosure. For a person of ordinary skill in the art, without creative effort, other figures can also be obtained according to these figures.

Figure 1:
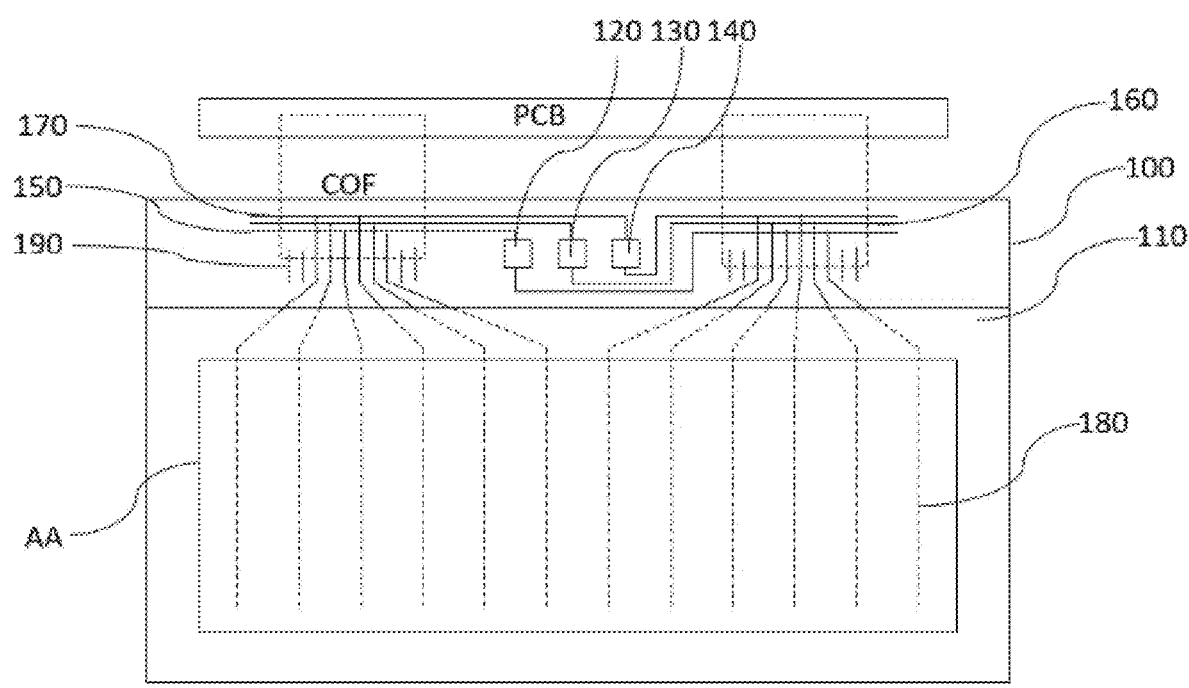
FIG. 1 is a structural diagram illustrating not electrically isolating testing lines from line electrodes of a display panel according to an embodiment of the present disclosure.

Wherein, array substrate 100, color filter substrate 110, first signal input point 120, second signal input point 130, third signal input point 140, first testing line 150, second testing line 160, third testing line 170, line electrode 180, unused soldering pin 190, laser area 200, first electrostatic protection line 210, second electrostatic protection line 220, third electrostatic protection line 230, display area AA.

DESCRIPTION OF SPECIFIC EMBODIMENTS OF THE INVENTION

Embodiments of the present disclosure are described in detail with the technical matters, structural features, achieved objects, and effects with reference to the accompanying drawings as follows. It is clear that the described embodiments are part of embodiments of the present disclosure, but not all embodiments. Based on the embodiments of the present disclosure, all other embodiments to those of ordinary skill in the premise of no creative efforts obtained, should be considered within the scope of protection of the present disclosure.

In the description of the present disclosure, it should be understood that orientations or position relationships indicated by the terms "center", "longitudinal", "lateral", "length", "width", "thickness", "upper", "lower", "front", "rear", "left", "right", "vertical", "horizontal", "top", "bottom", "inside", "outside", "clockwise", and "counter-clockwise" are based on orientations or position relationships illustrated in the drawings. The terms are used to facilitate and simplify the description of the present disclosure, rather than indicate or imply that the devices or elements referred to herein are required to have specific orientations or be constructed or operate in the specific orientations. Accordingly, the terms should not be construed as limiting the present disclosure. In addition, the term "first", "second" are for illustrative purposes only and are not to be construed as indicating or imposing a relative importance or implicitly indicating the number of technical features indicated. Thus, a feature that limited by "first", "second" may expressly or implicitly include at least one of the features. In the description of the present disclosure, the meaning of "plural" is two or more, unless otherwise specifically defined.

In the description of the present disclosure, it should be noted that unless otherwise clearly defined and limited, the terms "mounted", "connected/coupled", and "connection" should be interpreted broadly. For example, the terms may refer to a fixed connection, a detachable connection, or an integral connection; the terms may also refer to a mechanical connection, an electrical connection, or communication with each other; the terms may further refer to a direct connection, an indirect connection through an intermediary, or an interconnection between two elements or interactive relationship between two elements. Those skilled in the art can understand the specific meanings of the above-mentioned terms in the present disclosure according to circumstances.

In the present disclosure, it should be noted that unless otherwise clearly defined and limited, a first feature "on" or "under" a second feature may mean that the first feature directly contacts the second feature, or that the first feature contacts the second feature via an additional feature there between instead of directly contacting the second feature. Moreover, the first feature "on", "above", and "over" the second feature may mean that the first feature is right over or obliquely upward over the second feature or mean that the first feature has a horizontal height higher than that of the second feature. The first feature "under", "below", and "beneath" the second feature may mean that the first feature is right beneath or obliquely downward beneath the second feature or mean that that horizontal height of the first feature is lower than that of the second feature.

The following description provides various embodiments or examples for implementing various structures of the present disclosure. To simplify the description of the present disclosure, parts and settings of specific examples are described as follows. Certainly; they are only illustrative, and are not intended to limit the present disclosure. Further, reference numerals and reference letters may be repeated in different examples. This repetition is for purposes of simplicity and clarity and does not indicate a relationship of the various embodiments and/or the settings. Furthermore, the present disclosure provides specific examples of various processes and materials, however, applications of other processes and/or other materials may be appreciated those skilled in the art.

As shown in FIG. 1, a thin-film transistor liquid crystal display panel (TFT-LCD) is taken as an example, and an electrostatic protection method for a display panel is provided.

The display panel includes an array substrate 100, a color filter substrate 110 disposed opposite to the array substrate 100, and a chip on film (COF) substrate connected to the array substrate 100. A plurality of line electrodes 180 parallel to each other are disposed on the array substrate 100. During a process of testing an image quality of a display area AA of the display panel, disposing a first testing line 150, a second testing line 160, and a third testing line 170. The first testing line 150, the second testing line 160 and the third testing line 170 are connected to a data line, which is configured to test a R signal, a G signal, and a B signal of the display panel, by a first signal input point 120, a second signal input point 130, and a third signal input point 140 respectively.

Three adjacent line electrodes 180, connected sequentially to the first testing line 150, the second testing line 160, and the third testing line 170 respectively, are chosen from the plurality of line electrodes 180 parallel to each other, until all of the plurality of line electrodes 180 parallel to each other are connected to the first testing line 150, the second testing line 160, and the third testing line 170 respectively.

In addition, specifically, the display panel includes a plurality of COF substrates. As the resolution of display panels varies, the number of corresponding COF substrates will also vary. The COF substrates are connected to the array substrate 100 sequentially. A gate on array (GOA) signal of the display panel is imported into the display panel only through a first COF substrate and a last COF substrate. Soldering pins of a remaining COF substrate disposed on a same position with soldering pins of the first COF substrate and the last COF substrate configured to input the GOA signal are unused soldering pins 190.

Figure 2:
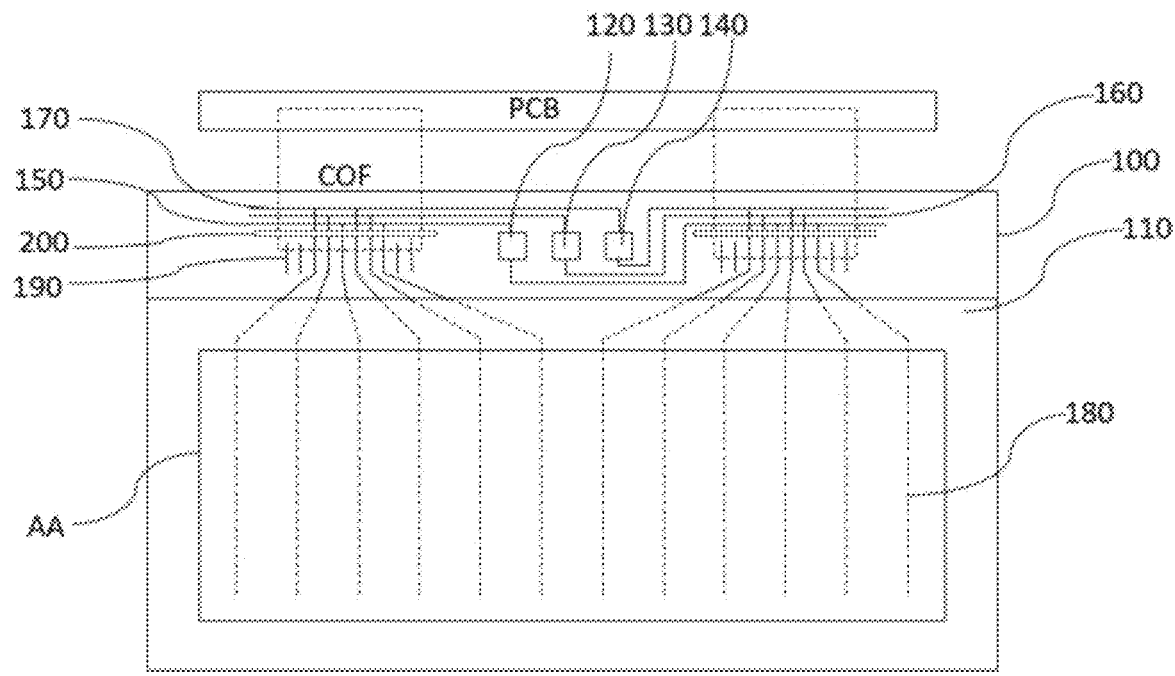
FIG. 2 is a structural diagram illustrating electrically isolating testing lines from line electrodes of the display panel according to an embodiment of the present disclosure.

After the process of testing the image quality of the display panel by the first testing line 150, the second testing line 160, and the third testing line 170, electrically isolating the first testing line 150, the second testing line 160, and the third testing line 170 from the plurality of line electrodes 180 parallel to each other of the array substrate 100. As shown in FIG. 2, because the first testing line 150, the second testing line 160, and the third testing line 170 are isolated from the plurality of line electrodes 180 parallel to each other by laser cutting according to the present embodiment, a laser area 200 is generated.

Figure 3:
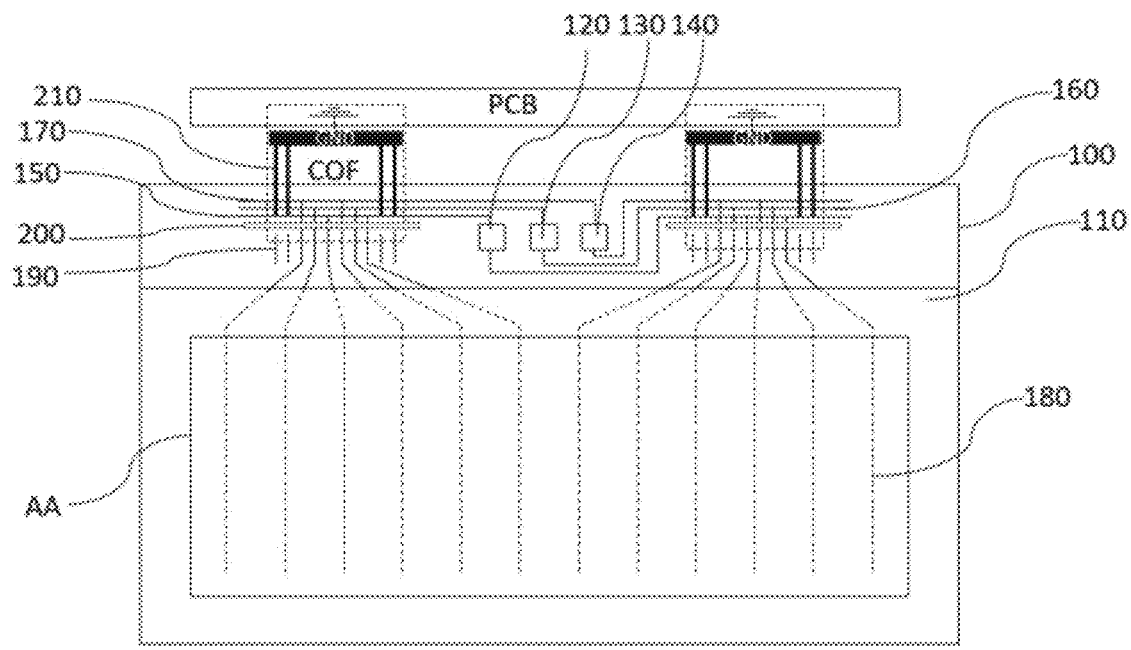
FIG. 3 is a structural diagram illustrating connecting remaining testing lines to a grounding line of a COF substrate by first electrostatic protection lines of the display panel according to an embodiment of the present disclosure.

Three remaining testing lines are obtained by isolating electrically the first testing line 150, the second testing line 160, and the third testing line 170 from the line electrodes 180 of the array substrate 100. As shown in FIG. 3, the three remaining testing lines are connected to a grounding line (GND) of the COF substrate by a first electrostatic protection line 210, in order to prevent external static electricity from being imported into the display panel by the three remaining testing lines.

Figure 4:
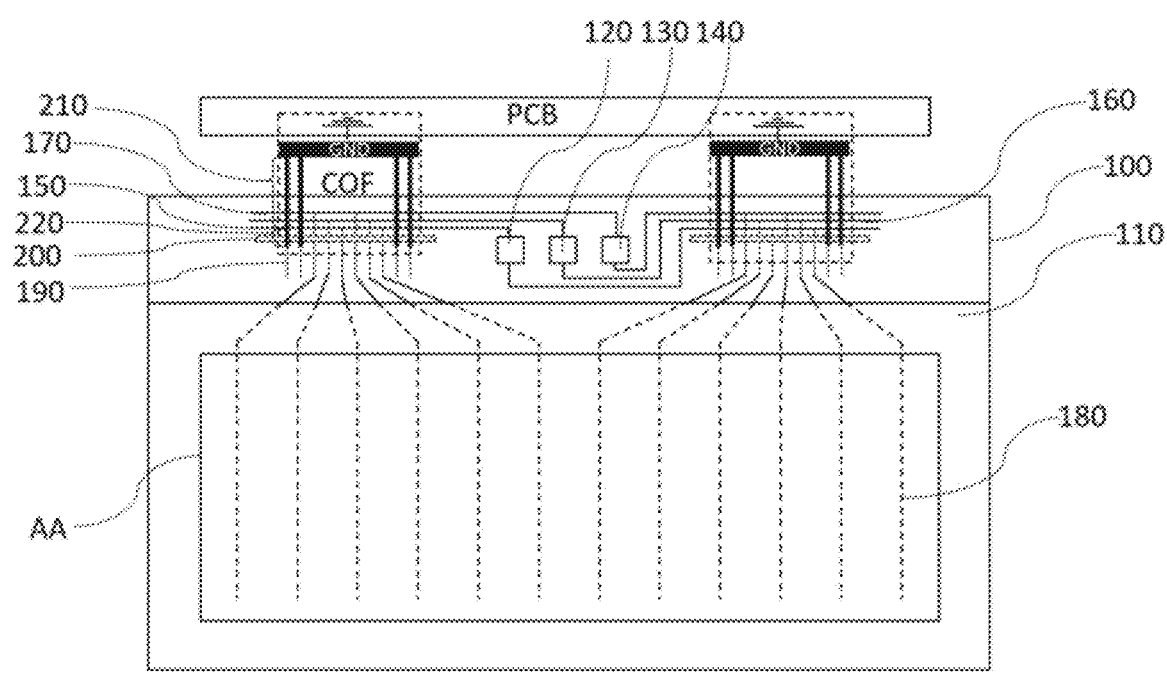
FIG. 4 is a structural diagram illustrating connecting unused soldering pins of the COF substrate to the first electrostatic protection lines by second electrostatic protection lines of the display panel according to an embodiment of the present disclosure.
Figure 5:
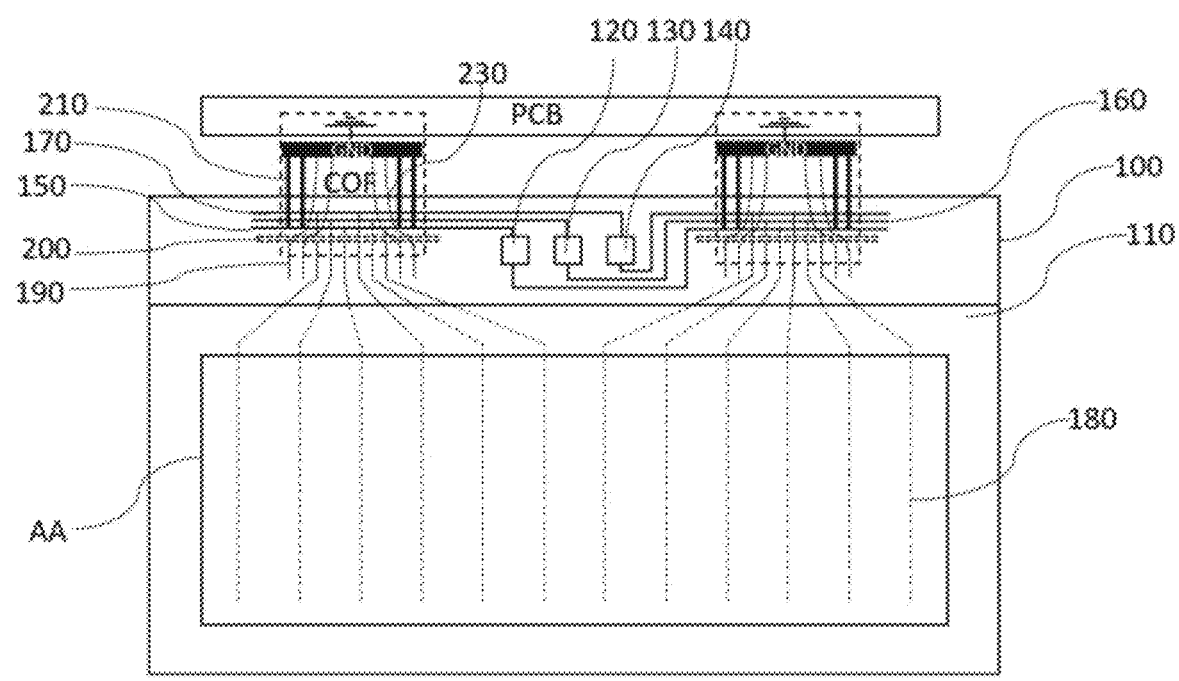
FIG. 5 is a structural diagram connecting the unused soldering pins of the COF substrate to the grounding line of the COF substrate by third electrostatic protection lines of the display panel according to an embodiment of the present disclosure.

As shown in FIG. 4, according to other embodiments, the unused soldering pins 190 of the COF substrate can be connected to the first electrostatic protection line 210 by a second electrostatic protection line 220 to make the unused soldering pins 190 further connect to the grounding line (GND) of the COF substrate. As shown in FIG. 5, according to other embodiments, the unused soldering pins 190 of the COF substrate also can be directly connected to the grounding line (GND) of the COF substrate by a third electrostatic protection line 230.

According to other embodiments of the present disclosure, the display panel further includes a printed circuit board (PCB). The array substrate 100 is connected to the PCB by the COF substrate. In a specific electrostatic protection method, the grounding line (GND) of the COF substrate is connected to a grounding pin of the PCB by a fourth electrostatic protection line (not shown in FIG).

The electrostatic protection circuit of the display panel provided by the present embodiment can quickly release static electricity generated by the display panel by connecting the remaining testing lines of the display panel to the grounding line of the COF substrate, thereby reducing the generation of static electricity and protecting the whole display panel.

The present embodiment additionally provides an electrostatic protection circuit for a display panel. The display panel includes the array substrate 100, the COF substrate 20 connected to the array substrate 100, and three remaining testing lines. The electrostatic protection circuit includes a first electrostatic protection line 210 configured to connect the three remaining testing lines to the grounding line (GND) of the COF substrate.

In another embodiment, a COF substrate includes an unused soldering pin 190. An electrostatic protection circuit further includes a second electrostatic protection line 220 configured to make an unused soldering pin 190 connect to a first electrostatic protection line 210.

In another embodiment, a COF substrate includes an unused soldering pin 190. An electrostatic protection circuit further includes a third electrostatic protection line 230 configured to connect the unused soldering pin 190 to the grounding line of the COF substrate.

In another embodiment, a display panel further includes a PCB. An array substrate 100 is connected to a PCB by a COF substrate. An electrostatic protection circuit further includes a fourth electrostatic protection line (not shown in FIG) configured to connect a grounding line (GND) to the COF substrate connect to the grounding pin of the PCB.

The present embodiment further provides a display panel, and the display panel uses an electrostatic protection method of the display panel as described in any of the above embodiments.

For a specific limitation of the display panel, please refer to the above limitation of the electrostatic protection method of the display panel, which will not be repeated here. The display panel can be, but is not limited to, a TFT-LCD panel, an OLED display panel, a micro LED display panel, a mini LED display panel, or a uLED display panel.

The present embodiment further provides a display device including an above-mentioned display panel.

For a specific limitation of the display device, please refer to the above limitation of the display panel, and the electrostatic protection method of the display panel, which will not be repeated here.

The electrostatic protection method of the display panel, the display panel and the display device provided by the embodiments of the present disclosure are described in detail. The principles and implementations of the present disclosure are described in combination with specific embodiments. The above description of the embodiments is merely for the purpose of understanding the disclosure. In the meantime, for those skilled in the art, there will be changes in the specific implementation and application scope according to the idea of the present disclosure. In conclusion, the content of the specification of the present disclosure should not be construed as limitations of the scope of the present disclosure.

What is claimed is:

1. An electrostatic protection circuit of a display panel, wherein the display panel comprises an array substrate, a chip on film (COF) substrate connected to the array substrate, and at least a remaining testing line;
    wherein the electrostatic protection circuit comprises:
        at least a first electrostatic protection line configured to connect at least the remaining testing line to a grounding line of the COF substrate;
    wherein the display panel comprises a plurality of COF substrates sequentially connected to the array substrate, and a gate on array (GOA) signal of the display panel is imported into the display panel only through a first COF substrate and a last COF substrate;
    wherein a plurality of first soldering pins of a remaining COF substrate, except first soldering pins of the first COF substrate and of the last COF substrate, are connected to the grounding line of the COF substrate, wherein the plurality of first soldering pins of the remaining COF substrate are disposed on a same position of a plurality of first soldering pins of the first COF substrate and the last COF substrate configured to input the GOA signal.

2. The electrostatic protection circuit of the display panel as claimed in claim 1, wherein the COF substrate comprises at least a second soldering pin;
    wherein the electrostatic protection circuit further comprises:
        at least a second electrostatic protection line configured to connect at least the second soldering pin to at least the first electrostatic protection line; and
        at least a third electrostatic protection line configured to connect at least the second soldering pin to the grounding line of the COF substrate.

3. The electrostatic protection circuit of the display panel as claimed in claim 1, wherein the display panel further comprises a printed circuit board connected to the array substrate by the COF substrate, and the COF substrate comprises at least a second soldering pin;
    wherein the electrostatic protection circuit further comprises:
        at least a second electrostatic protection line configured to connect at least the second soldering pin to at least the first electrostatic protection line; and
        a fourth electrostatic protection line configured to make the grounding line of the COF substrate to a grounding pin of the printed circuit board.

4. The electrostatic protection circuit of the display panel as claimed in claim 1,
    wherein the display panel further comprises a printed circuit board connected to the array substrate by the COF substrate, and the COF substrate comprises at least a second soldering pin;
    wherein the electrostatic protection circuit further comprises:
        at least a third electrostatic protection line configured to connect at least the second soldering pin to the grounding line of the COF substrate; and
        a fourth electrostatic protection line configured to connect the grounding line of the COF substrate to a grounding pin of the printed circuit board.

5. The electrostatic protection circuit of the display panel as claimed in claim 1, wherein the display panel further comprises a printed circuit board connected to the array substrate by the COF substrate, and the COF substrate comprises at least a second soldering pin;
  wherein the electrostatic protection circuit further comprises:
    at least a second electrostatic protection line configured to connect at least the second soldering pin to at least the first electrostatic protection line;
    at least a third electrostatic protection line configured to connect at least the second soldering pin to the grounding line of the COF substrate; and
    a fourth electrostatic protection line configured to connect the grounding line of the COF substrate to a grounding pin of the printed circuit board.

6. The electrostatic protection circuit of the display panel as claimed in claim 1, wherein the COF substrate comprises at least a second soldering pin;
  wherein the electrostatic protection circuit further comprises:
    at least a second electrostatic protection line configured to connect at least the second soldering pin to at least the first electrostatic protection line.

7. The electrostatic protection circuit of the display panel as claimed in claim 1, wherein the COF substrate comprises at least a second soldering pin;
  wherein the electrostatic protection circuit further comprises:
    at least a third electrostatic protection line configured to connect at least the second soldering pin to the grounding line of the COF substrate.

8. The electrostatic protection circuit of the display panel as claimed in claim 1, wherein the display panel further comprises a printed circuit board connected to the array substrate by the COF substrate;
  wherein the electrostatic protection circuit further comprises:
    a fourth electrostatic protection line configured to connect the grounding line of the COF substrate to a grounding pin of the printed circuit board.

9. The electrostatic protection circuit of the display panel as claimed in claim 1, wherein the display panel comprises three remaining testing lines.

10. The electrostatic protection circuit of the display panel as claimed in claim 1, wherein a plurality of line electrodes parallel to each other are disposed on the array substrate.

11. An electrostatic protection method of a display panel, wherein the display panel comprises an array substrate, at least a chip on film (COF) substrate connected to the array substrate, and a plurality of line electrodes parallel to each other and disposed on the array substrate, wherein the method comprises:
  disposing a first testing line, a second testing line, and a third testing line respectively connected to a data line configured to test a R signal, a G signal, and a B signal of the display panel, during a process of testing an image quality of the display panel;
  choosing three adjacent line electrodes from the plurality of line electrodes parallel to each other, and connecting the three adjacent line electrodes sequentially to the first testing line, the second testing line, and the third testing line respectively, until all of the plurality of line electrodes parallel to each other are connected to the first testing line, the second testing line, and the third testing line respectively;
  electrically isolating the first testing line, the second testing line, and the third testing line from the plurality of line electrodes parallel to each other to obtain three remaining testing lines, after the process of testing the image quality of the display panel by the first testing line, the second testing line, and the third testing line;
  connecting the three remaining testing lines to a grounding line of at least the COF substrate by an electrostatic protection line;
  wherein the display panel comprises a plurality of COF substrates sequentially connected to the array substrate, and a gate on array (GOA) signal of the display panel is imported into the display panel only through a first COF substrate and a last COF substrate, wherein the electrostatic protection method further comprises:
  connecting a plurality of first soldering pins of a remaining COF substrate, except first soldering pins of the first COF substrate and of the last COF substrate, to the grounding line of the COF substrate, wherein the plurality of first soldering pins of the remaining COF substrate are disposed on a same position of a plurality of soldering pins of the first COF substrate and the last COF substrate configured to input the GOA signal.

12. The electrostatic protection method of the display panel as claimed in claim 11, wherein at least the COF substrate comprises at least a second soldering pin, and the electrostatic protection method further comprises:
  connecting at least the second soldering pin to the grounding line of at least the COF substrate.

13. The electrostatic protection method of the display panel as claimed in claim 11, wherein the display panel further comprises a printed circuit board, wherein the electrostatic protection method further comprises:
  connecting the grounding line of at least the COF substrate to a grounding pin of the printed circuit board.

14. The electrostatic protection method of the display panel as claimed in claim 11, wherein the display panel further comprises a printed circuit board, and at least the COF substrate comprises at least a second soldering pin, wherein the electrostatic protection method further comprises:
  connecting at least the second soldering pin to the grounding line of at least the COF substrate, and connecting the grounding line of the COF substrate to a grounding pin of the print circuit board.

15. The electrostatic protection method of the display panel as claimed in claim 11, wherein the step of isolating the first testing line, the second testing line, and the third testing line from the plurality of line electrodes parallel to each other to obtain the three remaining testing lines, after the process of testing the image quality of the display panel by the first testing line, the second testing line, and the third testing line comprises:
  isolating the first testing line, the second testing line, and the third testing line from the plurality of line electrodes parallel to each other by laser cutting to obtain the three remaining testing lines.

16. The electrostatic protection method of the display panel as claimed in claim 11, wherein the first testing line, the second testing line, and the third testing line are respectively connected to a data line configured to test a R signal, a G signal, and a B signal of the display panel during a process of testing an image quality of the display panel.

17. A display panel, wherein the display panel is configured to use the electrostatic protection method as claimed in claim 11.

18. The display panel as claimed in claim 17, wherein the display panel comprises a thin-film transistor liquid crystal display (TFT-LCD) panel, an organic light-emitting diode (OLED) display panel, a micro light-emitting diode (micro LED) display panel, a mini light-emitting diode (mini LED) display panel, or an ultra light-emitting diode (μLED) display panel.

19. A display device, wherein the display device comprises the display panel as claimed in claim 17.

* * * * *